United States Patent
Kang et al.

(10) Patent No.: US 8,951,387 B2
(45) Date of Patent: Feb. 10, 2015

(54) METHOD AND APPARATUS FOR PEELING PROTECTION FILM FOR FLAT DISPLAY PANEL

(75) Inventors: Ji-Hyeon Kang, Yongin (KR); Hyun-Chul Lee, Yongin (KR); Won-Kyu Lim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 185 days.

(21) Appl. No.: 13/490,798

(22) Filed: Jun. 7, 2012

(65) Prior Publication Data

US 2012/0312481 A1    Dec. 13, 2012

(30) Foreign Application Priority Data

Jun. 13, 2011   (KR) .................. 10-2011-0057003

(51) Int. Cl.
*B32B 38/10* (2006.01)
*B29C 63/00* (2006.01)
*H01L 51/52* (2006.01)
*B29L 31/34* (2006.01)

(52) U.S. Cl.
CPC ......... B29C 63/0013 (2013.01); *H01L 51/5253* (2013.01); *B29L 2031/3475* (2013.01)
USPC ........... 156/712; 156/714; 156/715; 156/716; 156/753; 156/759; 156/764; 156/766

(58) Field of Classification Search
USPC ......... 156/712, 714, 715, 716, 717, 753, 759, 156/762, 764, 766
See application file for complete search history.

(56) References Cited

U.S. PATENT DOCUMENTS

| 4,880,488 | A * | 11/1989 | Matsuo et al. ................. 156/702 |
| 5,824,374 | A | 10/1998 | Bradley et al. |
| 6,503,130 | B2 * | 1/2003 | Lim ............................ 451/285 |
| 7,241,666 | B2 | 7/2007 | Goto et al. |
| 7,905,977 | B2 * | 3/2011 | Qi et al. ........................ 156/247 |
| 8,756,783 | B2 * | 6/2014 | Lu et al. ....................... 29/426.1 |
| 2006/0022579 | A1 * | 2/2006 | Wang et al. .................. 313/498 |
| 2008/0111492 | A1 * | 5/2008 | Kwak et al. ................ 315/169.3 |
| 2010/0282724 | A1 | 11/2010 | Kim et al. |

FOREIGN PATENT DOCUMENTS

| JP | 05-198496 | 8/1993 |
| JP | 2001-196332 | 7/2001 |
| JP | 2007276040 A * | 10/2007 |
| KR | 10-2005-0040735 | 5/2005 |
| KR | 10-2010-0120457 A | 11/2010 |

* cited by examiner

*Primary Examiner* — Mark A Osele
(74) *Attorney, Agent, or Firm* — Lee & Morse, P.C.

(57) ABSTRACT

An apparatus for removing a protective film for a flat display panel includes a laser oscillating member configured to be disposed over the protective film, the protective film attached to a surface of the flat display panel, the laser oscillating member configured to cut the protective film into a plurality of division regions by irradiating a laser beam; a separation member configured to peel at least one of the plurality of division regions from the flat display panel; a spacer member configured for insertion between the protective film and the at least one division region to be peeled from the flat display panel; and an adhesive member configured for attachment to a surface of the division region opposite the spacer member on the division region, the spacer member and the adhesive member being configured to move in a same direction.

10 Claims, 3 Drawing Sheets

METHOD AND APPARATUS FOR PEELING PROTECTION FILM FOR FLAT DISPLAY PANEL

CROSS-REFERENCE TO RELATED PATENT APPLICATION

This application claims the benefit of Korean Patent Application No. 10-2011-0057003, filed on Jun. 13, 2011, in the Korean Intellectual Property Office, the disclosure of which is incorporated herein in its entirety by reference.

BACKGROUND

1. Field

One or more embodiments relate to a method and apparatus for peeling protection film for flat display module.

2. Description of the Related Art

Organic light-emitting display apparatuses have a larger viewing angle, better contrast characteristics, and faster response speeds than other display devices.

Organic light-emitting display apparatuses have a self-emitting organic light-emitting device. Organic light-emitting display apparatuses generally have a stacked structure including an anode, a cathode, and an emission layer interposed between the anode and the cathode. The devices display images in color when holes and electrons, injected respectively from the anode and the cathode, recombine in the emission layer and, thus, light is emitted. However, it is difficult to achieve a high light-emission efficiency, and thus intermediate layers, including an electron injection layer, an electron transport layer, a hole transport layer, a hole injection layer, etc., are optionally additionally interposed between the emission layer and each of the electrodes.

Organic light-emitting display apparatuses are very sensitive to moisture or oxygen and may deteriorate due to moisture or oxygen. Thus, lifespan of an organic light-emitting display apparatus may be reduced due to moisture or oxygen. In order to protect an organic light-emitting display apparatus from moisture or oxygen, an encapsulation thin film formed of an encapsulation glass or a polymer is used.

SUMMARY

One or more embodiments may provide an apparatus for removing a protective film for a flat display panel, the apparatus including a laser oscillating member configured to be disposed over the protective film, the protective film attached to a surface of the flat display panel, the laser oscillating member configured to cut the protective film into a plurality of division regions by irradiating a laser beam; a separation member configured to peel at least one of the plurality of division regions from the flat display panel; a spacer member configured for insertion between the protective film and the at least one division region to be peeled from the flat display panel; and an adhesive member configured for attachment to a surface of the division region opposite the spacer member on the division region, the spacer member and the adhesive member being configured to move in a same direction.

The laser oscillating member may be configured to irradiate a laser beam, the laser beam having an absorption ratio with respect to the protective film that is higher than an absorption ratio with respect to the flat display panel.

The laser oscillating member may be configured to irradiate a laser beam for absorption into the protective film to cut the protective film.

The laser oscillating member may include a single pulse laser device.

The at least one division region to be peeled may correspond to a pad portion of the flat display panel.

The separation member may include a roller on which adhesives are disposed.

The roller may be attached to an edge portion of the division region, and the roller may be configured to be lifted for peeling the division region from the flat display panel when the division region is attached to the edge portion.

The spacer member may include a body portion having a pillar shape, and a step portion extending from one end of the body portion, and the step portion may be inserted between the protective film and a removed portion of the division region for maintaining an interval between the protective film and the division region.

One end of the step portion may have a wedge shape.

The adhesive member may couple the division region with the spacer member.

The adhesive member may include a clamp having adhesives or a clamp having a vacuum chuck.

The flat display panel may be an organic light-emitting display panel.

The organic light-emitting display panel may include a substrate having an organic light-emitting device on one surface thereof, and an encapsulation thin film that is disposed on the substrate so as to cover the organic light-emitting device.

The protective film may be on the encapsulation thin film.

The encapsulation thin film may include polyimide.

One or more embodiments may provide a method of removing a protective film for a flat display panel, the method including cutting a protective film attached to one surface of the flat display panel into a plurality of division regions by irradiating a laser beam; partially peeling a division region from the flat display panel; maintaining an interval between the protective film and a removed portion of the division region; and completely removing the division region from the flat display panel.

The laser beam may have an absorption ratio with respect to the protective film that is higher than an absorption ratio with respect to the flat display panel.

The absorption of the laser beam into the protective film may cut the protective film.

The laser beam may be a single pulse laser beam.

At least one division portion to peeled may correspond to a pad portion of the flat display panel.

Partially peeling may include attaching a spacer member to an edge portion of the at least one division region, and lifting the spacer member to peel the at least one division region from the flat display panel.

The separation member may include a roller on which adhesives are disposed.

Maintaining an interval may include inserting a spacer member between the flat display panel and the removed portion of the at least one division region.

The spacer member may include a body portion having a pillar shape, and a step portion extending from one end of the body portion, and the step portion may be inserted between the flat display panel and the removed portion of the at least one division region to maintain an interval between the flat display panel and the division region.

One end of the step portion may have a wedge shape.

Completely removing the at least one division region from the flat display panel may include attaching an adhesive member to a surface of the division region opposite to the position of the spacer member on the division region; and removing the spacer member and the adhesive member in a single direction to separate the protective film from the flat display panel.

The adhesive member may move at a higher speed than that of the spacer member.

The adhesive member may include a clamp including adhesives or a clamp including a vacuum chuck.

The flat display panel may be an organic light-emitting display panel.

The organic light-emitting display panel may include a substrate including an organic light-emitting device formed on one surface thereof, and an encapsulation thin film on the substrate to cover the organic light-emitting device.

The protective film may be on the encapsulation thin film.

The encapsulation thin film may include polyimide.

BRIEF DESCRIPTION OF DRAWINGS

The above and other features and advantages of the embodiments will become more apparent by describing in detail exemplary embodiments thereof with reference to the attached drawings in which.

DETAILED DESCRIPTION

Hereinafter, embodiments will be described in detail by explaining exemplary embodiments thereof with reference to the attached drawings.

Referring to FIGS. 1 through 5, according to an embodiment, an apparatus for peeling a protection film for a flat display panel may include a laser oscillating member 110, a separation member 120, a spacer member 130, and an adhesive member 140. The peeling apparatus will be described in detail with reference to FIGS. 1 through 8.

Figure 1:
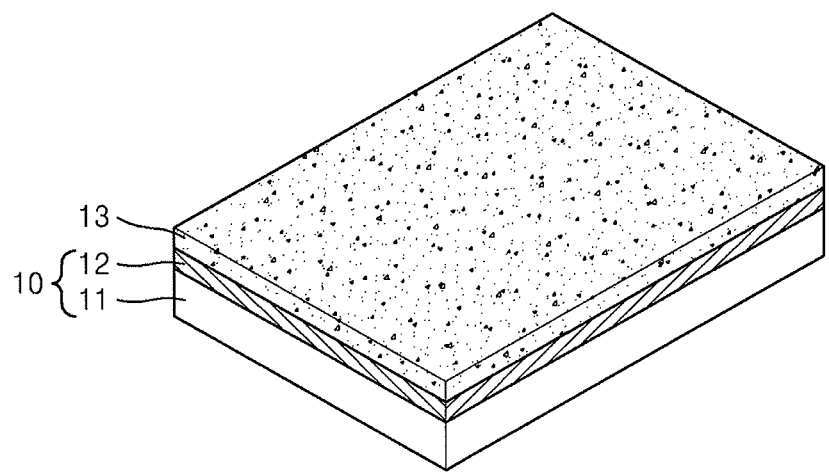
FIG. 1 illustrates a schematic perspective view of a flat display panel to which a protective film is attached, according to an embodiment.

FIG. 1 illustrates a schematic perspective view of a flat display panel 10 to which a protective film 13 is attached, according to an embodiment. The flat display panel 10 of FIG. 1 may be an organic light-emitting display apparatus or a liquid crystal display apparatus.

Referring to FIG. 1, the flat display panel 10 may include a substrate 11 and encapsulation thin film 12. A protective film 13 may be disposed on the encapsulation thin film 12. When the flat display panel 10 is an organic light-emitting display apparatus, a plurality of organic light-emitting devices (not shown) may be disposed on the substrate 11. The encapsulation thin film 12 may be formed on the substrate 11 so as to cover the organic light-emitting devices. The encapsulation thin film 12 may prevent moisture or impurities from penetrating into the organic light-emitting devices. The encapsulation thin film 12 may be formed of a polymer material such as polyimide.

The protective film 13 may be disposed on the encapsulation thin film 12 in order to protect the encapsulation thin film 12 during various processes that are performed after the encapsulation thin film 12 is formed on the substrate 11. The protective film 13 may include a polymer material such as polyethylene terephthalate (PET).

Figure 2:
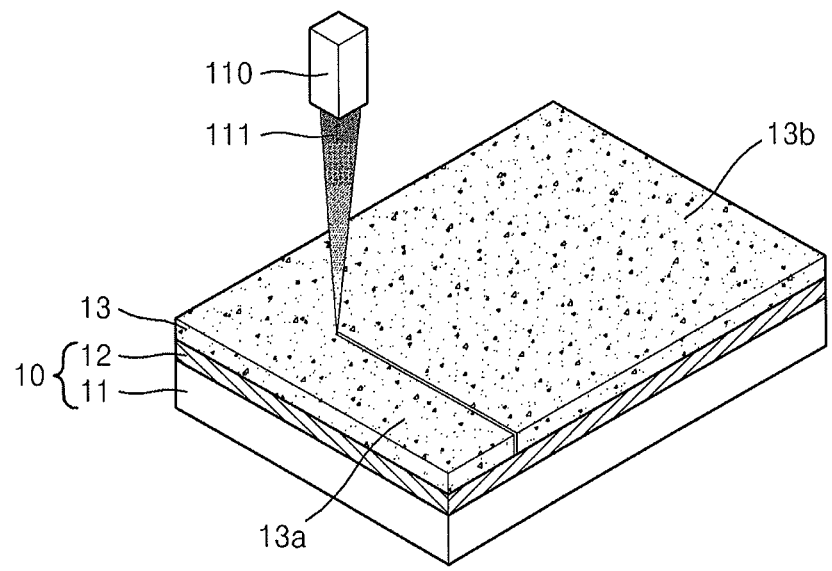
FIG. 2 illustrates a perspective view of a stage in a process of cutting a protective film, according to an embodiment.

FIG. 2 illustrates a perspective view of a stage in a process of cutting the protective film 13, according to an embodiment.

Referring to FIG. 2, the protective film 13 may be partially cut by the laser oscillating member 110. When the protective film 13 is attached to the flat display panel 10, various processes may be performed. In a process of connecting an external circuit to the flat display panel 10, or a process of testing an operational state of the flat display panel 10, a portion of the protective film 13 may be removed. In order to remove the portion of the protective film 13, the protective film 13 may be cut, as shown in FIG. 2.

The protective film 13 may be cut by irradiating a laser beam 111. The laser beam 111 used to cut the protective film 13 may be irradiated from the laser oscillating member 110. The laser oscillating member 110 may be disposed on, e.g., over, the protective film 13 and irradiate the laser beam 111 toward the flat display panel 10. The laser beam 111 may cut the protective film 13 while preventing the encapsulation thin film 12 from being damaged. The laser oscillating member 110 may generate the laser beam 111 of which an absorption ratio with respect to the protective film 13 is higher than an absorption ratio with respect to the flat display panel 10. In detail, the laser oscillating member 110 may generate the laser beam 111 of which an absorption ratio with respect to the protective film 13 of the flat display panel 10 is higher than an absorption ratio with respect to the encapsulation thin film 12 of the protective film 13. The laser beam 111 may be absorbed into the protective film 13 and may cut the encapsulation thin film 12 while preventing the encapsulation thin film 12 from being damaged. The laser oscillating member 110 may irradiate a single pulse laser beam. The single pulse laser beam may have a selective absorption ratio with respect to the protective film 13 and may cut the protective film 13 without damaging the encapsulation thin film 12.

The protective film 13 may be cut into a plurality of division regions by the laser beam 111. Referring to FIG. 2, the protective film 13 may be cut into a first division portion 13a and a second division portion 13b by the laser beam 111. The first division portion 13a may correspond to a pad portion (not shown) of the flat display panel 10, and the second division portion 13b may correspond to an emission layer. The first division portion 13a may connect an external circuit and the flat display panel 10 to each other, or may be removed to test an operational state of the flat display panel 10.

FIGS. 3 through 8 illustrate cross-sectional views of stages in a process of removing the first division portion 13a, according to an embodiment.

Figure 3:
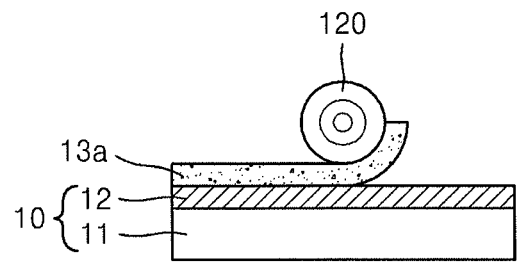
FIGS. 3 through 8 illustrate cross-sectional views of stages in a process of removing a first division portion, according to an embodiment.

FIG. 3 illustrates a process of peeling a portion of the first division portion 13a, which is cut by the separation member 120, from the flat display panel 10. In detail, the separation member 120 may be a roller on which adhesives are disposed. The separation member 120 may be attached to an edge of the first division portion 13a and may lift the first division portion 13a upwards so as to partially separate the first division portion 13a from the encapsulation thin film 12. Alternatively, the separation member 120 may be attached to the edge of the first division portion 13a and may roll the first division portion 13a from the edge towards a central portion thereof so as to partially separate the first division portion 13a from the encapsulation thin film 12.

Figure 4:
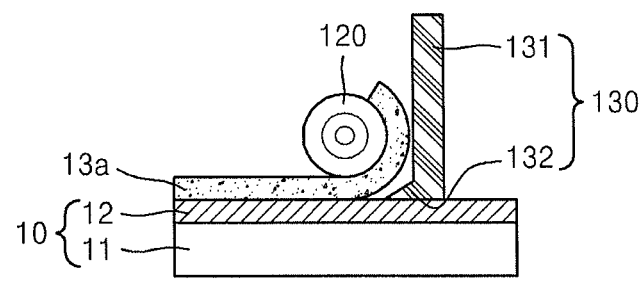

FIG. 4 illustrates a process of inserting the spacer member 130 between the first division portion 13a and the encapsulation thin film 12. The spacer member 130 may include a body portion 131 having a pillar shape, and a step portion 132 formed on one end of the body portion 131. As shown in FIG. 4, the spacer member 130 may be inserted between the encapsulation thin film 12 and the first division portion 13a that is partially peeled from the encapsulation thin film 12 by the separation member 120 so as to maintain an interval between the first division portion 13a and the encapsulation thin film 12. The step portion 132 may have a wedge shape.

Figure 5:
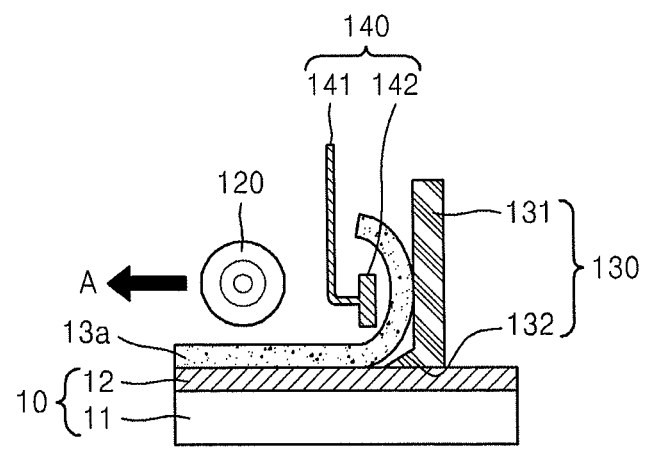
Figure 6:
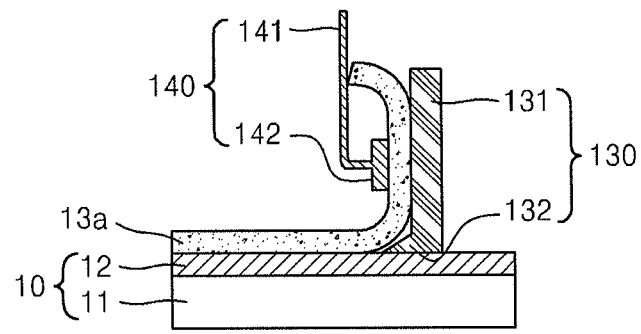

FIGS. 5 and 6 illustrate stages in a process of attaching the adhesive member 140 to the first division portion 13a. The adhesive member 140 may be attached to a first surface of the first division portion 13a that is partially peeled from the encapsulation thin film 12 by the spacer member 130. The adhesive member 140 may include a support 141, and an adhesive portion 142 formed on one end of the support 141. The adhesive portion 142 may be a clamp with adhesives formed on a surface thereof, or alternatively, may be a clamp having a vacuum chuck. The adhesive portion 142 may be attached to the first surface of the first division portion 13a. Referring to FIG. 6, the adhesive member 140 may be attached to the first surface of the first division portion 13a. The spacer member 130 may support a second surface of the first division portion 13a. The second surface of the first division portion 13a may be opposed to the first surface of the first division portion 13a.

Figure 7:
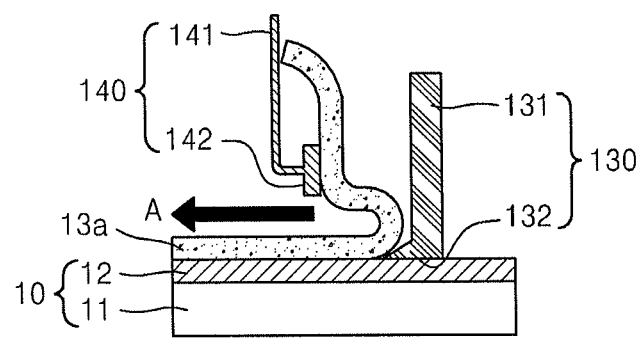
Figure 8:
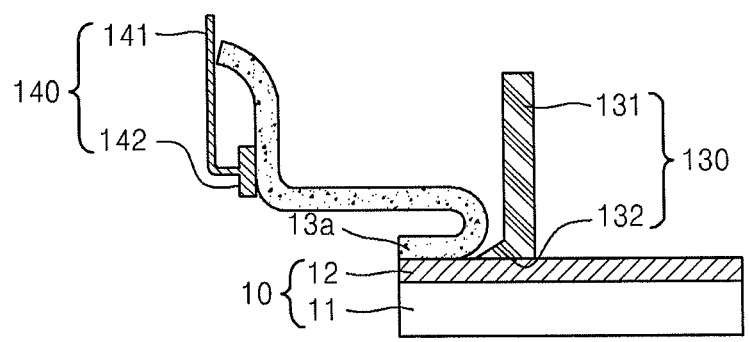

FIGS. 7 and 8 illustrate stages in a process of removing the first division portion 13a from the encapsulation thin film 12. Referring to FIG. 7, the adhesive member 140 attached to the first surface of the first division portion 13a may be moved in one direction to separate the first division portion 13a from the encapsulation thin film 12. The adhesive member 140 may remove the first division portion 13a from the encapsulation thin film 12 while moving together with the spacer member 130 in a direction A. The adhesive member 140 may remove the first division portion 13a from the encapsulation thin film 12 while moving at a higher speed than that of the spacer member 130.

After the protective film 13 is cut by using a single pulse laser beam, the protective film 13 may be removed, while preventing the encapsulation thin film 12 from being damaged, using the separation member 120, the spacer member 130, and the adhesive member 140.

According to one or more embodiments, a protective film attached to an encapsulation thin film may be removed while preventing the encapsulation thin film from being damaged.

While embodiments have been particularly shown and described with reference to exemplary embodiments thereof, it will be understood by those of ordinary skill in the art that various changes in form and details may be made therein without departing from the spirit and scope of the embodiments as defined by the following claims.

What is claimed is:

1. A method of manufacturing a flat display panel, the method comprising:
 providing a substrate having a plurality of organic light-emitting devices on the substrate, an encapsulation thin film being on the substrate over the organic light-emitting devices, and a protective film being on the encapsulation thin film on one surface of the flat display panel; and
 removing the protective film, removing the protective film including:
  cutting the protective film into a plurality of division regions by irradiating a laser beam;
 partially peeling at least one of the division regions from the encapsulation thin film;
  maintaining an interval between the encapsulation thin film and a removed portion of the division region, wherein maintaining the interval includes inserting a wedge-shaped step portion of a spacer member between the encapsulation thin film and the peeled edge portion of the at least one division region, the spacer member including a body portion having a pillar shape and the wedge-shaped step portion extending from one end of the body portion; and
  completely removing the at least one division region from the substrate, wherein completely removing the at least one division region from the substrate includes attaching an adhesive member to a surface of the division region, opposite to a position of the spacer member with respect to the division region, and moving the spacer member and the adhesive member in a single direction to separate the protective film from the substrate.

2. The method of claim 1, wherein the laser beam has an absorption ratio, with respect to the protective film, that is higher than an absorption ratio with respect to the encapsulation thin film.

3. The method of claim 1, wherein absorption of the laser beam into the protective film cuts the protective film.

4. The method of claim 1, wherein the laser beam is a single pulse laser beam.

5. The method of claim 1, wherein the at least one division portion to be peeled corresponds to a pad portion of the flat display panel.

6. The method of claim 1, wherein partially peeling includes attaching a separation member to an edge portion of the at least one division region, and lifting the separation member to peel the at least one division region from the flat display panel.

7. The method of claim 6, wherein the separation member includes a roller on which adhesives are disposed.

8. The method of claim 1, wherein the adhesive member moves at a higher speed than that of the spacer member.

9. The method of claim 1, wherein the adhesive member includes a clamp including adhesives or a clamp including a vacuum chuck.

10. The method of claim 1, wherein the encapsulation thin film includes polyimide.

* * * * *